United States Patent [19]

Uchida et al.

[11] Patent Number: 4,980,970

[45] Date of Patent: Jan. 1, 1991

[54] METHOD FOR MOUNTING ELECTRONIC PARTS ON PRINTED BOARDS

[75] Inventors: Kenji Uchida, Utsunomiya; Kiyomi Ohkubo; Makoto Matumoto, both of Shimodate, all of Japan

[73] Assignee: Fujitsu Limited, Kanagawa, Japan

[21] Appl. No.: 523,415

[22] Filed: May 15, 1990

[30] Foreign Application Priority Data

May 15, 1989 [JP] Japan .................................. 1-118542

[51] Int. Cl.[5] ............................................. H05K 3/30
[52] U.S. Cl. ........................................ 29/833; 29/701;
29/721; 29/740; 29/836
[58] Field of Search .................. 29/833, 834, 836, 701,
29/721, 740, 741, 832

[56] References Cited

U.S. PATENT DOCUMENTS 3,548,493 12/1970 Hubbard ................................ 29/833
3,831,250 8/1974 Holiday ............................. 29/833 X

OTHER PUBLICATIONS

"The Ragen P.C. Board Assembly System Cuts our Component Insertion Time in Half and ... Eliminates Errors", Walter Langseder, Jr.

*Primary Examiner*—Carl E. Hall
*Attorney, Agent, or Firm*—Staas & Halsey

[57] ABSTRACT

A method for mounting electronic parts on a printed board using a computer, an optical indicator controlled by the computer to optically indicate a position of insertion on the printed board into which an electronic part is to be inserted, and a parts locator having a plurality of pockets and controlled by the computer to rotate and open only one pocket is disclosed. Parts taken out at random from a parts box are put into opened pockets of a parts locator, or after the parts are inserted into the positions of insertion on the printed board indicated by the optical indicator, the remaining parts are put into the opened pockets of the parts locator. Subsequent mounting work can be performed only by taking out the parts from the pockets of the parts locator and inserting the parts into the optically indicated positions.

2 Claims, 6 Drawing Sheets

FIG. 1

| Item | Part Symbol | Part Name | Part No. | Std. No./Remarks | |
|---|---|---|---|---|---|
| 80 | 1 | C 8 | ceramic capacitor | N42L-1263-0002#9RH223M | 0.022UF 50V |
| 81 | 1 | R 2 | resistor | H40L-3301-0303#1E01300F | 13KU 1/4W |

FIG. 2

| Sequence | 1st Step | 2nd Step | 3rd Step | 4th Step | 5th Step | 6th Step | 7th Step | 8th Step |
|---|---|---|---|---|---|---|---|---|
| 1 | R2 | R4 | R5 | L2 | TR1 | C2 | R9 | D3 |
| 2 | R8 | R11 | L1 | R6 | C1 | R10 | TR3 | R7 |

METHOD FOR MOUNTING ELECTRONIC PARTS ON PRINTED BOARDS

BACKGROUND OF THE INVENTION

The present invention relates to a method for mounting electronic parts on printed boards.

With the recent remarkable progress in electronics, printed board units (electronic circuit packages) constructed by mounting electronic parts on printed boards have come to be widely used not only for electric products but also for other products in various fields and there is an increasing demand for the same. In the part insertion work in fabricating the printed board unit, when handling electronic parts with leads such as ICs, a dedicated automatic inserting machine is often used to have the leads of the parts inserted into the through holes made in a printed board. However, it is not always possible to insert parts into through holes automatically due to technical and economic limitations. Whenever automatic insertion is impossible, for example with such parts as special form parts and those in the dead space of the automatic inserting machine, or units of which the produced quantity is very small are assembled, the work is performed manually. For this reason, a highly efficient method for manually assembling printed board units is strongly demanded.

Figure 1:
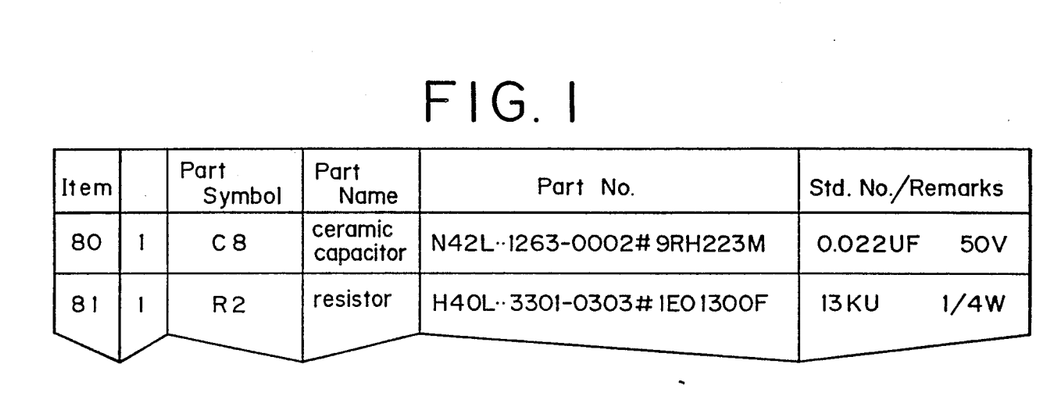
FIG. 1 is a drawing showing an example of a parts list.
Figure 2:
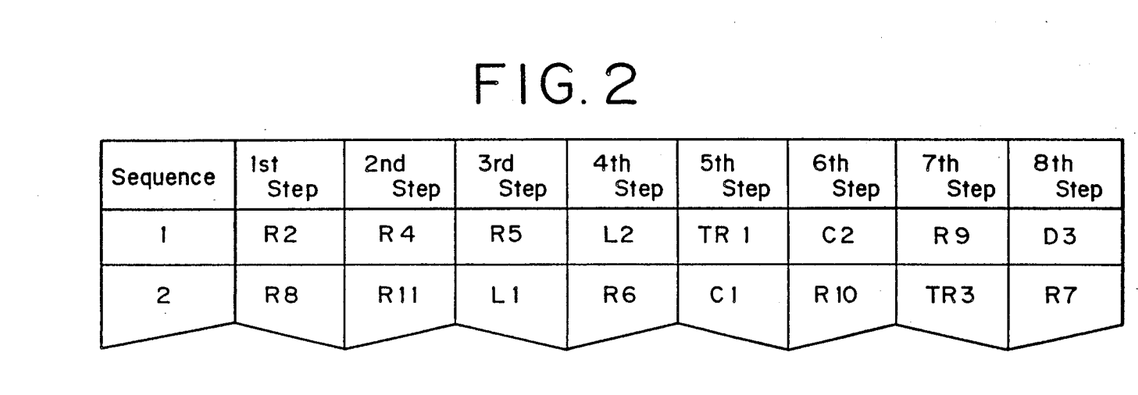
FIG. 2 is a drawing showing an example of a list of sequence of insertion.

The method for mounting electronic parts on a printed board by manual operation in the prior art was performed following the procedures described below. First, the drawing number of a part (part number) is read from the part delivery slip attached to the part taken out from a parts box, the part of that number is detected from the parts list as shown in FIG. 1, and the corresponding part symbol is read. Then, reference is made to the list of sequence of insertion as shown in FIG. 2 and the position of insertion of the part with that part symbol is detected from a mounting drawing, not shown, and the electronic part is inserted into the position on the printed board.

Figure 3A:
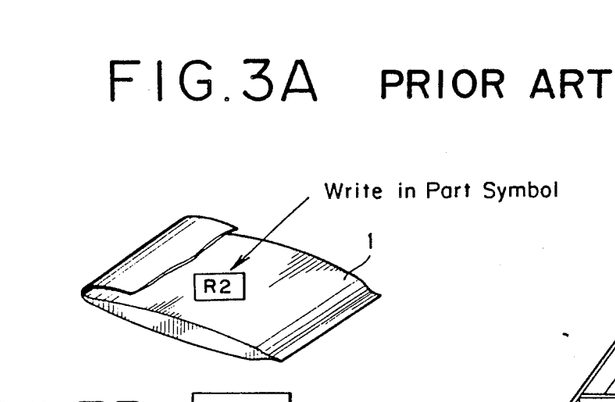
FIG. 3A to FIG. 3C are explanatory drawings of a prearrangement process in a conventional method.
Figure 3B:
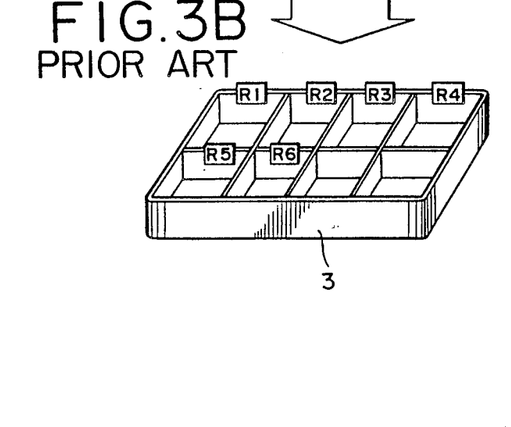
Figure 3C:
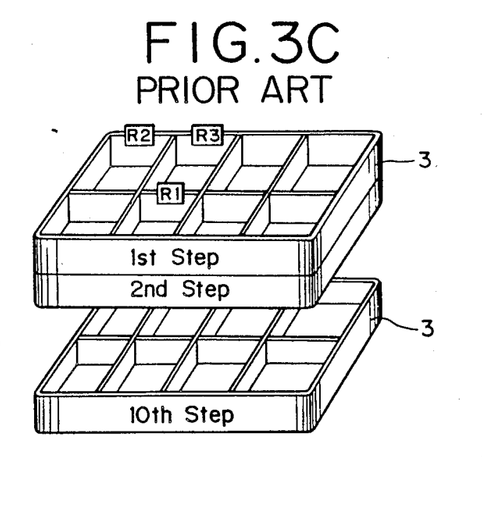

An assembling method in which prearrangement work of electronic parts to be inserted is made in advance and then a plurality of printed boards are assembled was also practiced. Also in this assembling method, a parts list, list of sequence of insertion, mounting drawing, and so forth are prepared first. Then, the part drawing number of the part picked out from a parts box is read by the eye and the parts list as shown in FIG. 1 is searched for that part number. Then, a part symbol according to the parts list is attached to the part bag 1 that was taken out and the bag is put into a parts prearrangement box as shown in FIG. 3B, in the order of the part symbol. Then, the parts prearrangement boxes 3 are piled up in the order of insertion as shown in FIG. 3C, and thereby prearrangements of the parts according to the sequence of insertion are made. After such prearrangements have been made, a deficient parts list for insufficient parts is made, and thus the prearrangement work is completed. After the part prearrangements have been completed, the parts are taken out in the prearranged order from the part prearrangement box 3 for the first assembling process, and the parts are inserted into positions on the printed board with reference to the mounting drawing. These operations are repeated and thus assembly of the printed board is accomplished.

In the method of mounting electronic parts on printed boards by manual operation practiced in the prior art as described above, great man-hours were required for comparison of the parts with the parts list, location of the positions of insertion, and the like, and it was a problem with it that extremely long time is taken for assembling printed board units. In the method of mounting without making prearrangements, wrong insertion or the like was possible to be made and hence reliability on the insertion work was low. If the prearrangement work is made, the wrong insertion of parts can be prevented but extremely long time is required for the prearrangement work.

In order to overcome these defects, there is proposed a method for mounting electronic parts on a printed board using a computer, an optical indicator controlled by the computer for indicating a position of insertion of a part on a printed board, and a parts locator with a plurality of pockets rotatably controlled by the computer. In this mounting method, the parts to be inserted are sorted first and each of the sorted parts are put in their respective pockets of the parts locator. Then, while data of pocket numbers of the parts locator and data of kinds of the parts contained in the pockets are input to the computer, the data of kinds of the parts to be inserted into positions on the printed board and data of the positions of insertion are also input to the computer. When an insertion work starting signal is input to the computer, one pocket of the parts locator is opened and the optical indicator optically indicates the position of insertion of the part. The operator inserts parts one after another into optically indicated positions. When insertion of one kind of parts has been finished, the parts locator is rotated, whereupon the operator takes out other parts from the then opened pocket and inserts the parts into the positions indicated by the optical indicator. By the above described conventional method using the optical indicator and parts locator, the efficiency of the mounting work is greatly improved because the operator need not make comparison of the parts with a parts list, detection of the positions of insertion, and so forth. However, in the described conventional method, there was a problem that it was required first to sort parts to be put into each of the pockets and then to put the sorted parts into the pockets and it was also required to make laborious data inputting work each time to have the data of the pocket number of the parts locator and the data of kinds of the parts contained in each of the pockets input to the computer.

SUMMARY OF THE INVENTION

Accordingly, an object of the present invention is to provide a method for mounting electronic parts on a printed board which overcomes the defects in the prior art and is capable of greatly reducing manhours for assembling printed board units by manual operation.

In accordance with an aspect of the present invention, there is provided a method for mounting electronic parts on printed boards using a computer, an optical indicator controlled by the computer to optically indicate a position of insertion on the printed board into which an electronic part is to be inserted, and a parts locator having a plurality of pockets and controlled by the computer to rotate and open only one pocket, comprising the steps of (a) inputting, in advance, to the computer data of list of parts to be inserted into positions on a printed board and data of the positions of insertion, (b) setting at least one printed board on which parts are to be mounted at a printed board setting portion, (c) taking out at random a set of parts to be inserted from a parts box, comparing the part with a parts list displayed on a display, and selecting the part on the display which corresponds to the part taken out, (d) causing the computer to search for the data of the position of insertion in response to the selection, (e) causing the optical indicator connected with the computer to optically indicate the position of insertion on the printed board in accordance with the result of the search, (f) inserting the taken out part into the optically indicated position, (g) putting, after mounting the taken out parts on the printed board in all the optically indicated positions, the remaining parts into an opened pocket of the parts locator, (h) repeating the above steps (c) to (g) for all of the parts in the parts box thereby completing parts mounting on the printed board, (i) storing in the computer data for insertion of all the parts for the printed board and data of the parts locator, (j) setting at least another printed board at the printed board setting portion, (k) inputting a signal indicative of completion of parts mounting or a signal indicative of completion of setting the new printed board to the computer, thereby causing the parts locator to rotate and open its pocket containing the parts to be inserted first and the optical indicator to optically indicate the position of insertion of the part, (1) inserting the part taken out from the opened pocket into the optically indicated position, (m) inputting a signal indicative of completion of mounting to the computer when the mounting of corresponding parts in all positions optically indicated has been completed, thereby causing the parts locator to rotate and open the pocket containing the parts to be inserted next and the optical indicator to optically indicate the position of insertion of the part, (n) inserting the part taken out from the opened pocket into the optically indicated position, (o) repeating the above steps (m) and (n) for all the parts contained in the parts locator thereby completing mounting parts on the new printed board, and (p) repeating the above steps (j) to (o) for all desired number of printed boards.

In accordance with another aspect of the present invention, there is provided a method for mounting electronic parts on printed boards using a computer, an optical indicator controlled by the computer to optically indicate a position of insertion on the printed board into which an electronic part is to be inserted, and a parts locator having a plurality of pockets and controlled by the computer to rotate and open only one pocket, comprising the steps of (a) inputting, in advance, to the computer data of list of parts to be inserted into positions on a printed board and data of the positions of insertion, (b) taking out at random a set of parts to be inserted from a parts box, comparing the part with a parts list displayed on a display, and selecting the part on the display which corresponds to the part taken out, (c) causing the computer to search for the data of the position of insertion in response to the selection and the parts locator to open its one pocket, (d) putting the taken out parts into the opened pocket of the parts locator, (e) causing the computer to store data of the pockets and data of parts contained therein, (f) repeating the above steps (b) to (e) for all the parts in the parts box, (g) setting at least one printed board on which parts are to be mounted at a printed board setting portion, (h) inputting a signal indicative of completion of setting a printed board to the computer, thereby causing the parts locator to rotate and open its pocket containing the part to be inserted first and the optical indicator to optically indicate the position of insertion of the part, (i) inserting the part taken out from the opened pocket into the optically indicated position, (j) inputting a signal indicative of completion of mounting to the computer when the mounting of corresponding parts in all positions optically indicated has been completed, thereby causing the parts locator to rotate and open the pocket containing the parts to be inserted next and the optical indicator to optically indicate the position of insertion of the part, (k) inserting the part taken out from the opened pocket into the optically indicated position, (1) repeating the above steps (j) and (k) for all the parts contained in the parts locator thereby completing mounting parts on the printed board, and (m) repeating the above steps (g) to (1) for all desired number of printed boards.

In the above described method for mounting electronic parts on printed boards, by the operation of the operator taking out at random parts to be inserted from the parts box and putting the parts into the pockets of the parts locator, the data of the pocket numbers and the data of the parts contained in each of the pockets are automatically stored in the computer. Therefore, the operator can put the parts into the pockets of the parts locator without paying attention to inputting of parts data. When a pocket of the parts locator is opened in the process of part insertion, the position of insertion of the part contained therein is indicated by the optical indicator, and hence the operator is only required to take out the part from the pocket and insert the part into the position indicated by the optical indicator.

The above and other objects, features and advantages of the present invention and the manner of realizing them will become more apparent, and the invention itself will best be understood, from a study of the following description and appended claims, with reference had to the attached drawings showing some preferred embodiments of the invention.

DESCRIPTION OF THE PREFERRED EMBODIMENTS

An embodiment of the present invention will be described below in detail with reference to the accompanying drawings.

Figure 4:
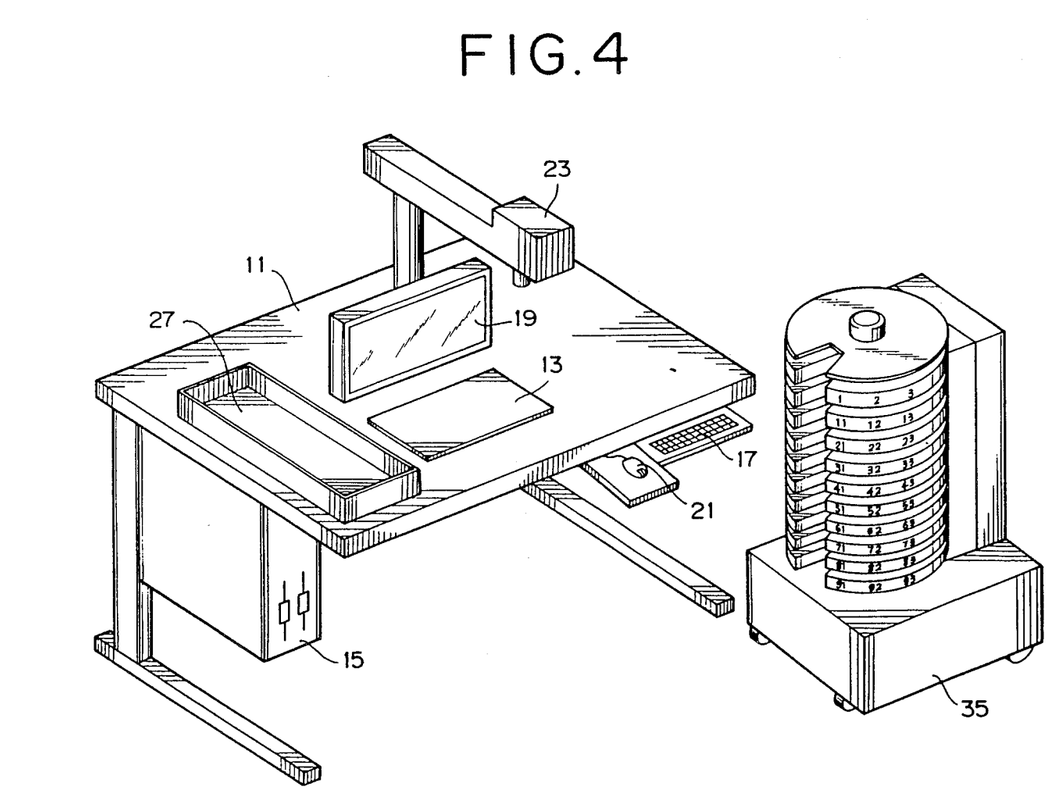
FIG. 4 is a perspective view of an apparatus used in a method of the present invention.

Referring to FIG. 4, in which a perspective view of an embodiment of an apparatus used in the method of the present invention is shown, there is a printed board 13 for supporting parts mounted thereon, set in position at a printed board setting portion on a working table 11. Reference numeral 15 denotes a personal computer for controlling the present apparatus. To the personal computer 15 are connected a keyboard 17, a display 19, and a mouse 21. Reference numeral 23 denotes an optical indicator controlled by the personal computer 15 for optically indicating the position of insertion of a part.

On the working table 11, there is placed a parts box 27 containing parts to be inserted.

Figure 5:
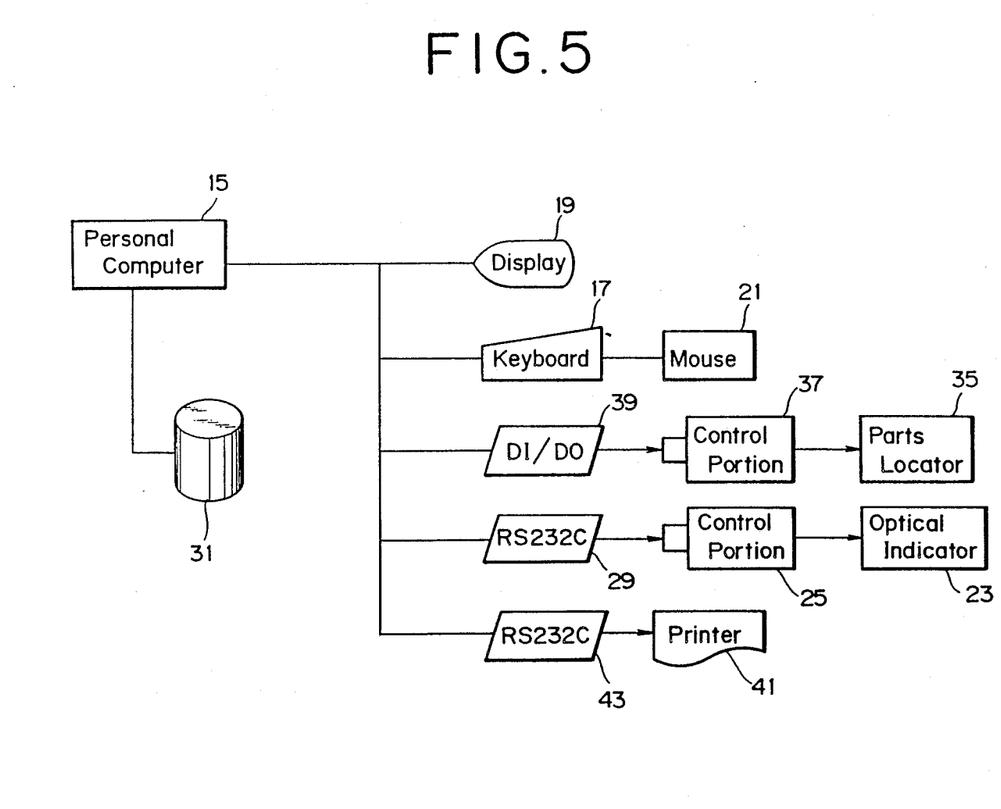
FIG. 5 is a block diagram showing system structure of the apparatus of FIG. 4.

Referring to FIG. 5, in which a block diagram of system structure of the apparatus of FIG. 1 is shown, there is provided a control portion 37 of a parts locator 35 connected with the personal computer 15 through a DI/DO interface 39 and a control portion 25 of the optical indicator 23 connected with the personal computer 15 through an RS232C interface 29. The system further includes a printer 41 connected thereto through an RS232C interface 43, which printer is for outputting data of deficient parts after the work for inserting parts has been finished. Reference numeral 31 denotes a hard disk memory for the personal computer 15.

There are formed a plurality of pockets on the parts locator 35, which is controlled for rotation by the personal computer 15 through the control portion 37, and, during its operation, it is adapted such that only one pocket thereof is opened at a time. When a signal is input from the mouse 21, the personal computer 15 issues a signal to the control portion 37, whereby the parts locator 35 is controlled to rotate and open a next pocket.

Figure 6A:
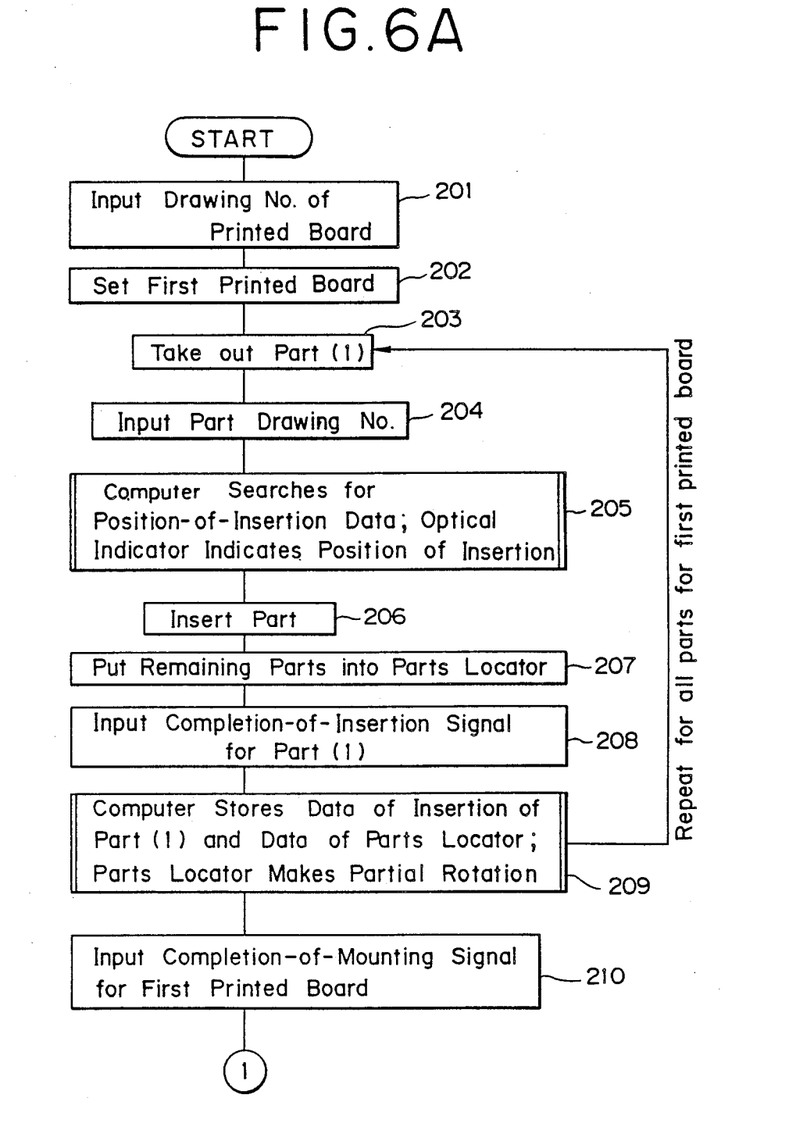
FIG. 6A and FIG. 6B are flow charts of an embodiment of the present invention.
Figure 6B:
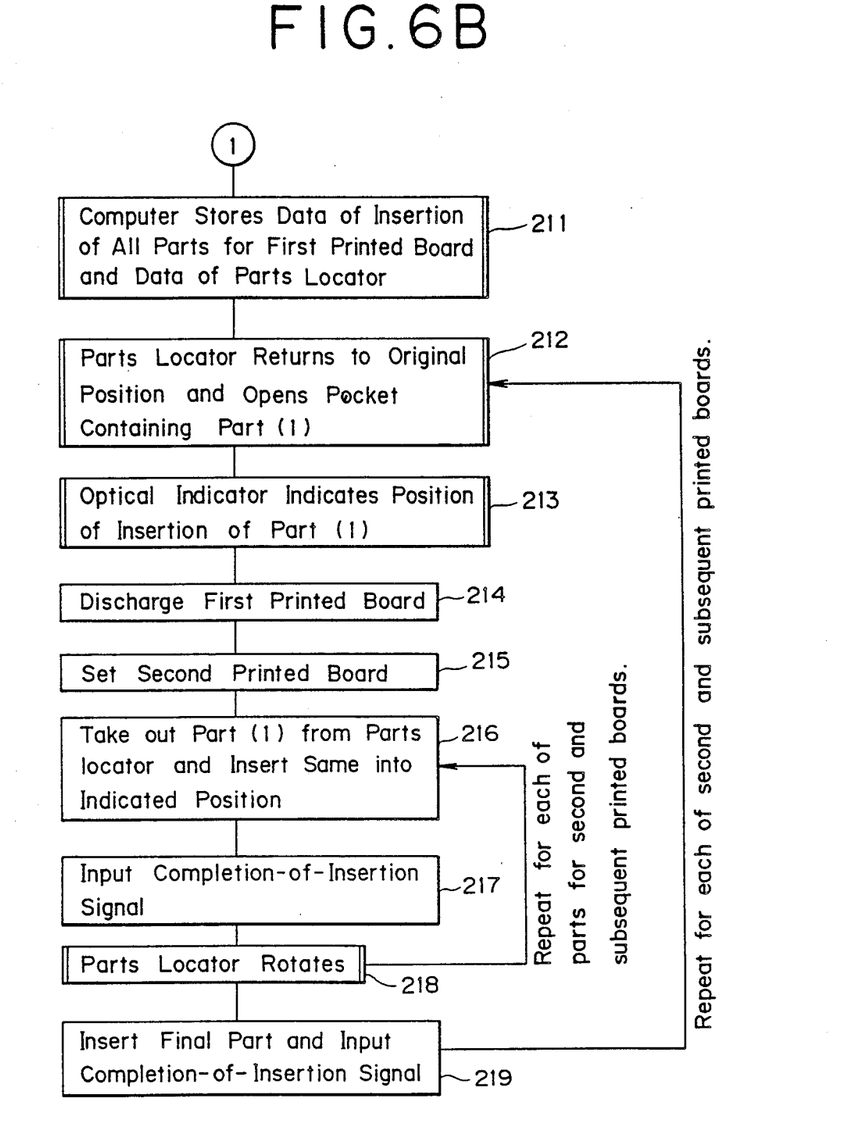

Operation of the present embodiment will be described below with reference to flow charts shown in FIG. 6A and FIG. 6B.

First, the drawing number of a printed board is input from a keyboard 17 (step 201) and the printed board 13 is set in position at the printed board setting portion on the working table 11 (step 202). Then, the operator takes out at random a part bag containing some parts from the parts box 27 (step 203). For convenience of explanation, the part will be referred to as part (1). The operator then finds, from the part list displayed on the display 19, the part in agreement with the taken out part and selects the part on the display with the mouse 21 (step 204). In accordance with the selection, the personal computer 15 searches for the data of the position of insertion and the optical indicator 23 indicates the position of insertion (step 205).

The operator inserts the part into the optically indicated position (step 206) and puts the remaining parts in an opened pocket of the parts locator 35 (step 207). Completion of the insertion of the part (1) is input with the mouse 21 (step 208), whereupon the personal computer 15 stores the data of insertion of the part (1) as well as the data of the parts locator 35, and the parts locator 35 rotates through an angle corresponding to one part (step 209).

The flow from step 203 to step 209 is repeated for all parts for the first printed board and when the mounting work for the first printed board is completed, the operator inputs a signal indicative of the completion of the mounting for the first printed board with the mouse 21 (step 210). Upon receipt of this input signal, the personal computer 15 completes storage of data of insertion of all the parts and the data of the parts locator 35 for the first printed board (step 211), and then the parts locator 35 returns to the original position, where the parts locator 35 opens the pocket containing the part (1) (step 212) and the optical indicator 23 indicates the position of insertion of the part (1) (step 213). The operator discharges the first printed board from the working table 11 (step 214) and thus the mounting work for the first printed board is ended.

Then, the operator sets a second printed board at the printed board setting portion on the working table 11 (step 215) and inputs a signal indicative of completion of setting with the mouse 21. Here, the program may be modified such that the step 212 and step 213 are not triggered by the completion-of-mounting signal at the step 210 but triggered by the completion-of-setting signal at the step 215. Then, the operator picks out the part (1) from the pocket of the parts locator 35 and inserts the part into the position indicated by the optical indicator 23 (step 216) and inputs a signal indicative of the completion of the insertion with the mouse 21 (step 217). In response to this completion-of-insertion signal, the parts locator 35 rotates and opens the next pocket (step 218). Step 216 to step 218 are repeated for each of the parts for the second printed board, and when insertion of the final part for that printed board has been completed, a signal indicative of completion of insertion is input with the mouse 21 (step 219). Step 212 to step 219 are repeated for the second and subsequent printed boards, and thus part mounting is completed for all the parts contained in the parts locator 35.

As described in the foregoing, the present embodiment is provided with the parts locator 35 and the optical indicator 23 for operation in association with the personal computer and the personal computer is adapted to store what kind of the part is contained in what pocket of the parts locator 35 and, therefore, the optical indication by the optical indicator 23 and the part supply by the parts locator 35 are performed in association only by inputting a signal indicative of completion of insertion with the mouse. Thus, the operator can simply repeat the insertion work.

In the above described embodiment, the operator inserted parts into the optically indicated positions of insertion on the first printed board and then put the remaining parts into the opened pocket of the parts locator 35, and, then, for mounting parts on the second and subsequent printed boards, the operator picked out a part from the pocket of the parts locator and inserted the part into the optically indicated position. However, the method of the present invention is not limited to be performed in the described way. That is, first, the parts taken out at random from the parts box may be put into the pockets of the parts locator, without mounting any on the printed board, and thereafter, each part may be picked out from each pocket and inserted into the position of insertion of the part on the printed board indicated by the optical indicator. Further, in the above described embodiment, one sheet of the printed board was set at the printed board setting portion, but a plurality of printed boards may be set at a time.

In the electronic part mounting method of the present invention, as described above, the need for the part prearrangement work can be eliminated and, hence, a great meritorious effect to save the assembling man-hour can be obtained. Therefore, efficient mounting work can be achieved and greatly improved quality of products can be obtained.

What is claimed is:

1. A method for mounting electronic parts on printed boards using a computer, an optical indicator controlled by said computer to optically indicate a position of insertion on the printed board into which an electronic part is to be inserted, and a parts locator having a plurality of pockets and controlled by said computer to rotate and open only one pocket, comprising the steps of:
    (a) inputting, in advance, to said computer data of list of parts to be inserted into positions on a printed board and data of the positions of insertion;

(b) setting at least one printed board on which parts are to be mounted at a printed board setting portion;

(c) taking out at random a set of parts to be inserted from a parts box, comparing the part with a parts list displayed on a display, and selecting the part on the display which corresponds to the part taken out;

(d) causing said computer to search for the data of the position of insertion in response to the selection;

(e) causing said optical indicator connected with said computer to optically indicate the position of insertion on the printed board in accordance with the result of the search;

(f) inserting the taken out part into the optically indicated position;

(g) putting, after mounting the taken out parts on said printed board in all the optically indicated positions, the remaining parts into an opened pocket of said parts locator;

(h) repeating the above steps (c) to (g) for all of the parts in the parts box thereby completing parts mounting on said printed board;

(i) storing in the computer data for insertion of all the parts for said printed board and data of said parts locator;

(j) setting at least another printed board at said printed board setting portion;

(k) inputting a signal indicative of completion of parts mounting or a signal indicative of completion of setting said another printed board to said computer, thereby causing said parts locator to rotate and open its pocket containing the parts to be inserted first and said optical indicator to optically indicate the position of insertion of the part;

(l) inserting the part taken out from the opened pocket into the optically indicated position;

(m) inputting a signal indicative of completion of mounting to the computer when the mounting of corresponding parts in all positions optically indicated has been completed, thereby causing the parts locator to rotate and open the pocket containing the parts to be inserted next and the optical indicator to optically indicate the position of insertion of the part;

(n) inserting the part taken out from the opened pocket into the optically indicated position;

(o) repeating the above steps (m) and (n) for all the parts contained in the parts locator thereby completing mounting parts on said another printed board; and (p) repeating the above steps (j) to (o) for all desired number of printed boards.

2. A method for mounting electronic parts on printed boards using a computer, an optical indicator controlled by said computer to optically indicate a position of insertion on the printed board into which an electronic part is to be inserted, and a parts locator having a plurality of pockets and controlled by said computer to rotate and open only one pocket, comprising the steps of:

(a) inputting, in advance, to said computer data of list of parts to be inserted into positions on a printed board and data of the positions of insertion;

(b) taking out at random a set of parts to be inserted from a parts box, comparing the part with a parts list displayed on a display, and selecting the part on the display which corresponds to the part taken out;

(c) causing said computer to search for the data of the position of insertion in response to the selection and said parts locator to open its one pocket;

(d) putting said taken out parts into the opened pocket of said parts locator;

(e) causing said computer to store data of said pockets and data of parts contained therein;

(f) repeating the above steps (b) to (e) for all the parts in said parts box;

(g) setting at least one printed board on which parts are to be mounted at a printed board setting portion;

(h) inputting a signal indicative of completion of setting a printed board to said computer, thereby causing said parts locator to rotate and open its pocket containing the parts to be inserted first and said optical indicator to optically indicate the position of insertion of the part;

(i) inserting the part taken out from the opened pocket into the optically indicated position;

(j) inputting a signal indicative of completion of mounting to the computer when the mounting of corresponding parts in all positions optically indicated has been completed, thereby causing the parts locator to rotate and open the pocket containing the parts to be inserted next and the optical indicator to optically indicate the position of insertion of the part;

(k) inserting the part taken out from the opened pocket into the optically indicated position;

(l) repeating the above steps (j) and (k) for all the parts contained in said parts locator thereby completing mounting parts on said printed board; and (m) repeating the above steps (g) to (l) for all desired number of printed boards.

* * * * *